United States Patent [19]

Tanaka et al.

[11] Patent Number: 5,052,005
[45] Date of Patent: Sep. 24, 1991

[54] METHOD OF MOUNTING A LASER DIODE UNIT

[75] Inventors: Haruo Tanaka, Shiga; Naotaro Nakata, Kyoto, both of Japan

[73] Assignee: Rohm Co., Ltd., Kyoto, Japan

[21] Appl. No.: 452,418

[22] Filed: Dec. 19, 1989

[30] Foreign Application Priority Data

Dec. 19, 1988 [JP] Japan .................................. 63-319857

[51] Int. Cl.$^5$ .............................................. H01S 3/04
[52] U.S. Cl. .................................. 372/36; 219/121.63; 219/121.64; 250/227.24; 357/72; 357/75; 357/80; 357/81; 369/122
[58] Field of Search ...................... 357/17, 19, 72, 74, 357/75, 80, 81; 369/44.12, 122; 372/36, 38; 219/121.45, 121.63, 121.64; 350/96.20; 250/227.24

[56] References Cited

U.S. PATENT DOCUMENTS

| | | | |
|---|---|---|---|
| 4,626,653 | 12/1986 | Sciaky et al. | 219/121.63 |
| 4,768,070 | 8/1988 | Takizawa et al. | 357/17 |
| 4,792,658 | 12/1988 | Langhans et al. | 219/121.63 |
| 4,837,768 | 6/1989 | Schmid | 372/36 |
| 4,906,065 | 3/1990 | Taumberger | 350/96.20 |

FOREIGN PATENT DOCUMENTS

| | | |
|---|---|---|
| 0199565 | 10/1986 | European Pat. Off. ............. 372/43 |
| 3137441 | 3/1983 | Fed. Rep. of Germany . |
| 2550645 | 2/1985 | France . |
| 56-69882 | 6/1981 | Japan .................................. 372/43 |
| 58-91692 | 5/1983 | Japan .................................. 372/36 |
| 60-52079 | 3/1985 | Japan .................................. 372/36 |
| 60-217687 | 10/1985 | Japan .................................. 372/43 |
| 62-260385 | 11/1987 | Japan .................................. 372/43 |
| 63-124485 | 5/1988 | Japan .................................. 372/43 |
| 63-200590 | 8/1988 | Japan .................................. 372/43 |

Primary Examiner—Frank Gonzalez

[57] ABSTRACT

In an optical pick-up arranged to detect information recorded on an optical disk by causing laser light projected onto and reflected from a signal surface of the optical disk disposed within an optical system, to be received by a light receiving element provided in the optical system, a method of mounting onto the optical pick-up is provided with a laser diode unit which includes a metallic substrate, a laser diode, a photo-diode, a current feeding lead portion to the laser diode and a current output lead portion from the photo-diode, respectively disposed at one side face in the direction of thickness of the metallic substrate for emitting the laser light. The laser diode unit is positioned and fixed at a predetermined position of the optical system through a mounting member. The mounting method of the laser diode unit includes the steps of setting the other side face in the direction of thickness of the substrate and the mounting member in a desired positional relation for contact with each other. As a result, a plurality of contact places therebetween may be simultaneously welded by laser light for combining the laser diode unit and the optical pick-up into one unit.

3 Claims, 3 Drawing Sheets

METHOD OF MOUNTING A LASER DIODE UNIT

BACKGROUND OF THE INVENTION

The present invention generally relates to a laser diode unit, and more particularly, to a method of mounting a laser diode unit on an optical pick-up for use in an optical disk player and the like, through proper positioning and fixing.

In FIG. 6, there is illustrated a conventional laser diode unit 100 to be incorporated in an optical pick-up for use in an optical disk player or the like. The laser diode unit 100 includes a stem 101, and three lead terminals 102, 104 and 106 extending through the stem 101 in a direction of its thickness, with upper ends thereof projecting from the upper surface of the stem 101. The lead terminal 102 has its projecting upper end electrically connected with a laser diode 108 for feeding electric current to the laser diode 108, while the lead terminal 104 has its projecting upper end also electrically connected with a photo-diode 110 for deriving therethrough, electric current to be outputted from a photo-diode 110.

More specifically, the laser light emitted from the laser diode 108 is received by the photo-diode 110, and electric current proportional to an amount of light thus received is applied from the photo-diode 110 to the lead terminal 104.

Accordingly, it becomes possible to automatically control the light emitting power (referred to as APC i.e. Automatic Power Control) of the laser diode 108 based on values of the above electric current.

Meanwhile, the lead terminal 106 has a function to subject the laser diode 108 and the photo-diode 110 to connection for grounding.

A ring-shaped or annular connecting member 112 is integrally attached around the stem 101, and a cap 113 in a cylindrical shape having a bottom portion open at its one end is mounted on the connecting member 112 for enclosing the laser diode 108, etc. within the laser diode unit 100. The stem 101 and the connecting member 112, and the connecting member 112 and the cap 113 are respectively combined into one unit by resistance welding or the like.

The bottom portion of the cap 113 is formed with a window opening 113A which is closed by a glass cover 114; therefore, the laser light emitted by the laser diode 108 is projected outwardly through the window 113A.

The known laser diode unit 100 having the construction as described above is filled in its interior, generally with an inert gas such as nitrogen gas or the like to prevent oxidation particularly at the light emitting end face of the laser diode 108.

However, in the conventional laser diode unit 100 as described so far, there are such disadvantages that, because the respective lead terminals 102, 104 and 106 are fixed to the stem 101 through hermetic sealing, manufacturing cost is increased as a result.

Moreover, the glass cover 114 to be fitted in the window opening 113A of the cap 113 is applied with an AR coating (Anti-Reflex Coating) for reduction of the reflection rate of the laser light by the glass cover 114. Thus, another cost increase is involved by such an AR coating processing.

Furthermore, due to the fact that a portion where one end of a wire for connecting the lead terminal 102 and the laser diode 108 are bonded, is gold-plated, with the stem 101 being plated by nickel, gold, etc., a further cost increase is also undesirably caused thereby.

Accordingly, there has been proposed, by the same assignee as in the present invention, another laser diode unit of this kind in which essential functioning portions such as the laser diode, photo-diode, etc. are provided on a sub-mount base, while the sub-mount base is mounted and fixed on a substrate provided with lead portions electrically connected to external circuits.

Incidentally, in the case where a laser diode unit is to be incorporated, through positioning and fixing, into an optical pick-up, allowance for the installation is limited only to several $\mu m$, and thus, a high accuracy is required for the mounting and incorporation. In the conventional laser diode unit 100, such incorporation is effected by fitting the unit 100 into a mating part provided on the side of the optical pick-up. However, in the laser diode unit proposed by the same assignee as in the present invention and referred to above, it is difficult to adopt the conventional practice for incorporation due to difference in the construction. Accordingly, there may be considered processing such as brazing, bonding by resins, etc., each of which, however, involves problems related the to the accuracy or the long processing time required.

SUMMARY OF THE INVENTION

Accordingly, an essential object of the present invention is to provide a method of mounting a laser diode unit proposed by the same assignee as in the present invention, onto an optical pick-up in a short time by maintaining the positioning thereof at a high accuracy.

Another object of the present invention is to provide a laser diode unit which is readily applied to the mounting method of the present invention for incorporation into an optical pick-up in an efficient manner.

In accomplishing these and other objects, according to one preferred embodiment of the present invention, there is provided a method of mounting a laser diode unit onto an optical pick-up as follows.

Specifically, in an optical pick-up arranged to detect information recorded on an optical disk by causing laser light projected onto and reflected from a signal surface of said optical disk disposed within an optical system, to be received by a light receiving element provided in said optical system, there is provided a method of mounting onto the optical pick-up, a laser diode unit which includes a metallic substrate, and a laser diode, a photodiode, a current feeding lead portion to the laser diode and a current output lead portion from the photo-diode, respectively provided at one side face in the direction of thickness of said metallic substrate for emitting the laser light. The laser diode unit is positioned and fixed at a predetermined position of said optical system through a mounting member.

The mounting method of the laser diode unit includes the steps of setting the other side face in the direction of thickness of said substrate and said mounting member in a desired positional relation for contact with each other, and thereafter, welding a plurality of contact places therebetween simultaneously by laser light for combining said laser diode unit and said optical pick-up into one unit.

As described above, by the mounting method of the laser diode unit according to the present invention, the laser diode unit is combined into one unit with the optical pick-up by simultaneously welding the plurality of places at which the other side face in the direction of thickness of the substrate of the laser diode unit and the mounting member at the side of the optical pick-up contact each other, by means of the laser light.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION FOR THE PREFERRED EMBODIMENTS OF THE INVENTION

Figure 1:
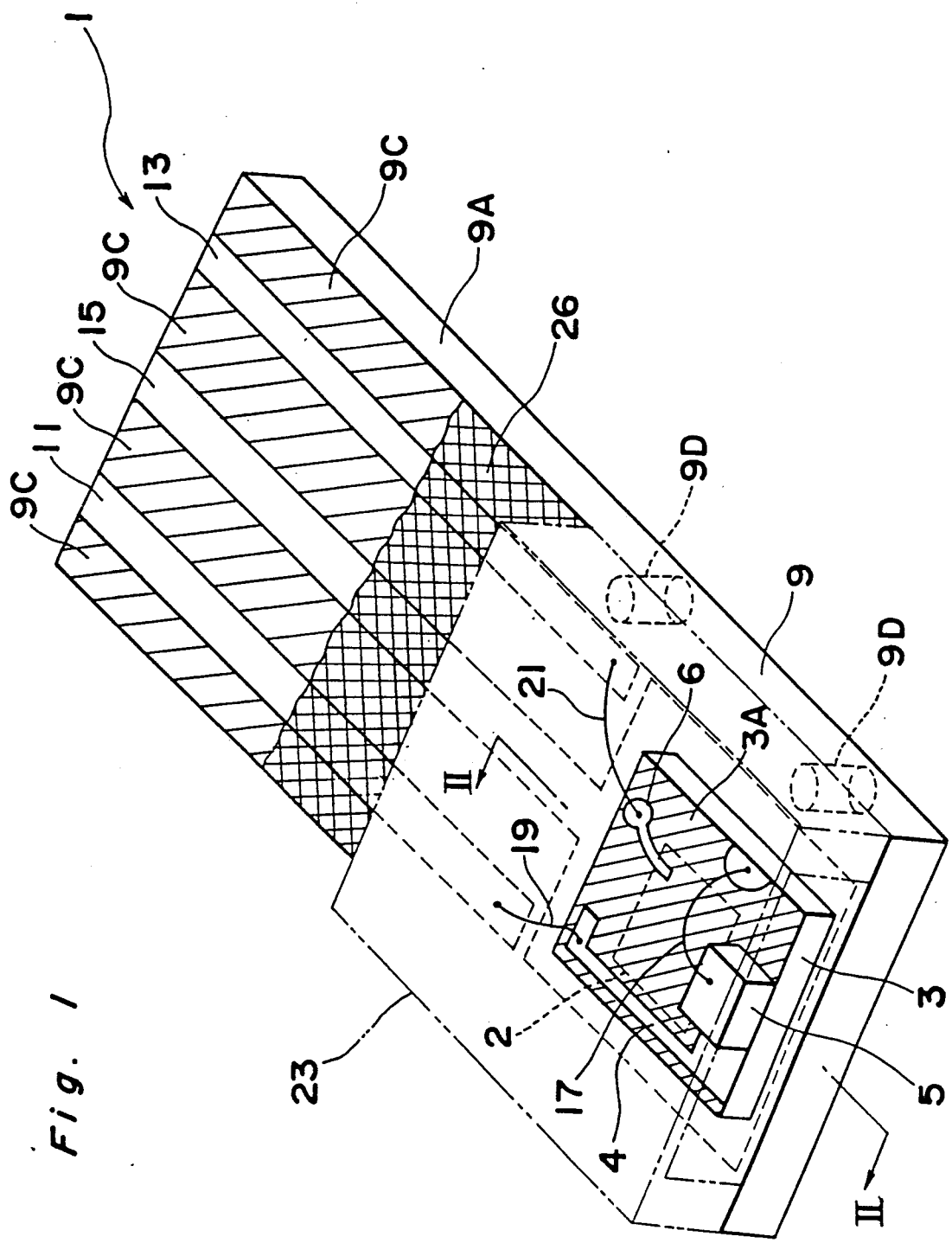
FIG. 1 is a schematic perspective view illustrating the general construction of a laser diode unit applicable to a laser diode unit mounting method according to one preferred embodiment of the present invention.

Before the description of the present invention proceeds, it is to be noted that like parts are designated by like reference numerals throughout the accompanying drawings.

Figure 2:
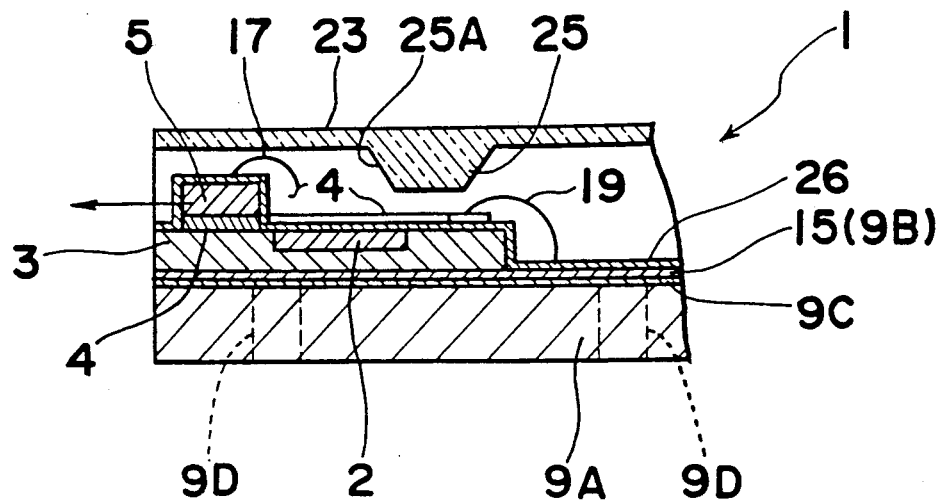
FIG. 2 is a fragmentary cross section taken along the line II—II in FIG. 1.

Referring now to the drawings, there is illustrated in FIGS. 1 and 2, a laser diode unit 1 which may be applied to the mounting method according to the present invention, and which generally includes a substrate 9 and a sub-mount base 3 provided on one side face in a direction of thickness of the substrate 9. The sub-mount base 3 (which also functions as a photo-diode as will be described later) is provided, on its one side face in a direction of thickness thereof, with a laser diode 5 and the function of the photo-diode 3 for receiving laser light emitted by the laser diode 5, and the substrate 9 is provided with a first lead portion 11 for feeding electric current as desired to the laser diode 5 and a second lead portion 13 for deriving electric current outputted from the photo-diode 3.

More specifically in FIGS. 1 and 2, the sub-mount electrically conductive base 3 formed, for example, into a square plate-like configuration by an electrically conductive material such as silicon or the like is bonded for fixing by Indium (In) or the like at one end portion in a longitudinal direction on one side face in the direction of thickness of the substrate 9.

Meanwhile, the substrate 9, which is a printed circuit board of a so-called high heat conduction type, is prepared by coating over one side face in the direction of thickness of the plate-like member 9A of Aluminum or the like, an electrically conductive thin film 9B of copper or the like through an insulating film 9C made of a non-conductive material. On the one side face of the substrate 9 formed with the thin film 9B of copper or the like, there are formed the first lead portion 11, the second lead portion 13 and a third lead portion 15 for electrical grounding by removing unnecessary porotions of the copper thin film 9B by a known practice.

It is to be noted here that the respective lead portions 11, 13 and 15 are formed in positions through proper intervals for preventing electrical short-circuits therebetween.

On the other hand, at one end portion in the longitudinal direction on the surface of the sub-mount base 3, the laser diode 5 is bonded so as to be fixed by an alloy of gold and tin, etc., with the laser diode 5 and the base 3 being electrically connected to each other by a wire 17.

It should also be noted here that in the present embodiment, the sub-mount base 3 is made of silicon (Si), and in a region 2 surrounded by a dotted line in FIG. 1, a P-N junction is formed through dispersion of impurities so as to obtain a P region in the case where the base 3 is set to be an N region. Consequently, the base 3 itself has a function as a photo-diode (therefore, the photo-diode is also represented by the numeral 3 depending on necessity).

The one side face 3A of the base 3 on which the laser diode 5 is provided is covered by a silicon dioxide (SiO$_2$), and is further mounted with an aluminum wire 4 for feeding electric current to the laser diode 5. Another aluminum wire 6 for taking out electric current is produced in the base 3 (i.e. the photo-diode 3), both of the wires 4 and 6 are provided by conventional means.

One end of the aluminum wire 4 is bonded and fixed to the laser diode 5, while one end of another wire 19 is bonded to be fixed to the other end of the aluminum wire 4, while the other end of said wire 19 is bonded and fixed to the lead portion 11.

Meanwhile, the aluminum wire 6 has its one end electrically connected to the region 2 by a known process, and its other end, bonded to one end of a wire 21 for fixing while the other end of the wire 21 is bonded and fixed to the lead portion 13.

Although the one end of the wire 17 is connected to the base 3 as described earlier, silicon dioxide (SiO$_2$) in the vicinity of the connecting portion is peeled off as is seen from FIG. 1.

According to the present invention, except for the portions where the respective lead portions 11, 13 and 15 are connected to other external electrical circuits (not shown), parts of each of the laser diode 5, the base 3 (the photo-diode), the wires 17, 19 and 21, and the lead portions 11, 13 and 15 are coated by a protective film 26 having a dielectric characteristic such as aluminum oxide (Al$_2$O$_3$) or the like by sputtering, etc.

The substrate 9 is further provided with a protective cover 23 for protecting the essential parts such as the laser diode 5, etc. from mechanical damages. The protective cover 23 has a generally U-shaped cross section, and is so designed as to have a shape and a size by which the important functioning parts mainly including the laser diode 5 are sufficiently protected in the state where the light emitting end portion of the laser diode 5 is exposed.

It is to be noted here that the protective cover 23 referred to above is formed by a high reflectance resin prepared by combining a metal having a high reflectance such as rutile or the like with a proper transparent resin, and is provided, at its reverse face side, with a reflecting portion 25 having a tapered face 25A integrally formed therewith at a position corresponding to the position of the base 3.

Inclination of the taper face 25A of the reflecting portion 25 is s set as to efficiently reflect the laser light of the laser diode 5 towards the region 2, i.e. in the direction of the light receiving surface of the photodiode 3.

For fixing the protective cover 23 onto the substrate 9, it is preferable to arrange for example, so that protrusions (not particularly shown) integrally formed with the protective cover 23 are extended through corresponding through-bores 9D formed in the substrate 9, with projecting portions of the protrusions being caulked or staked for fixing.

Subsequently, a method of mounting the laser diode unit 1 having the construction as described so far onto an optical pick-up will be described, which constitutes an essential aspect of the present invention.

In the first place, referring to FIG. 3, the function and construction of the optical pick-up 10 will be briefly described hereinafter.

Figure 3:
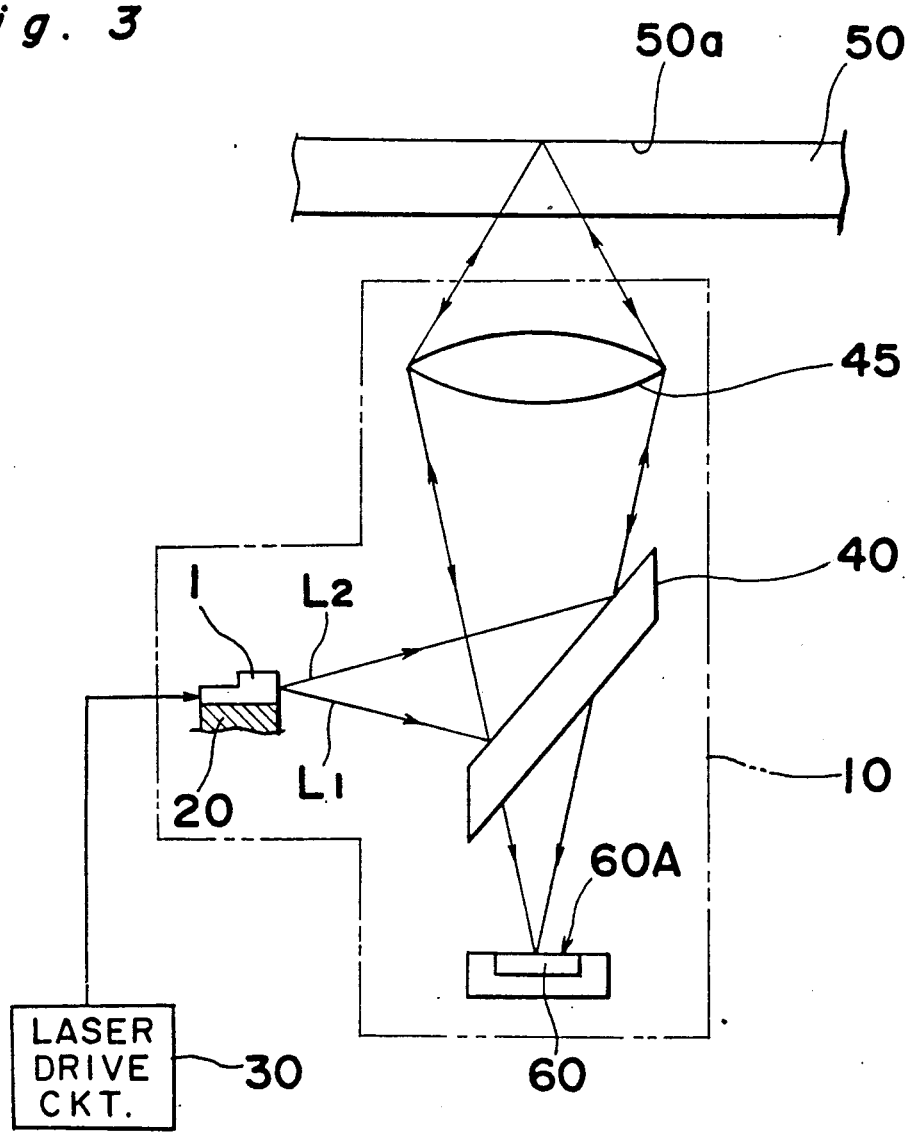
FIG. 3 is a schematic diagram representing the general construction of an optical pick-up to which the present invention may be applied.
Figure 6:
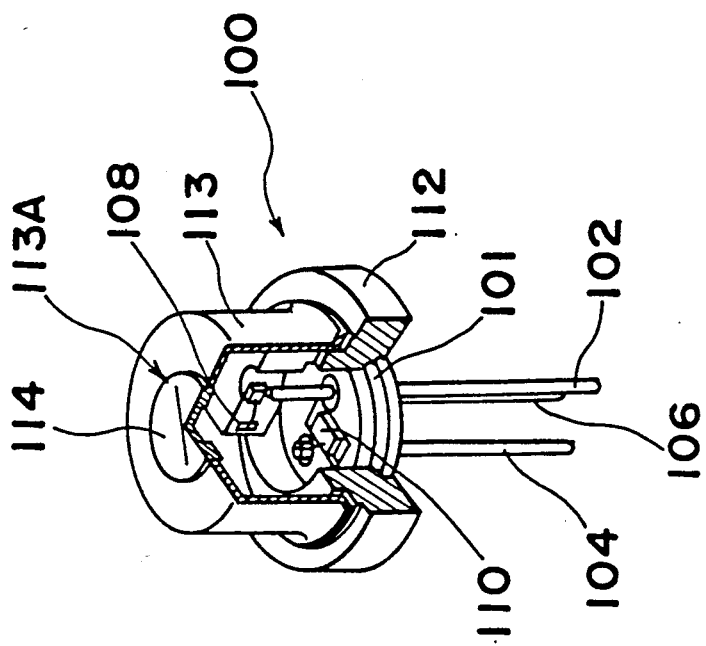
FIG. 6 is a perspective view, partly broken away, illustrating the construction of a conventional laser diode unit (already referred to).

In the arrangement of FIG. 3, laser light emitted from the laser diode unit 1 in a direction forming a sector shape as represented by optical paths L1 and L2, is once reflected by a half mirror 40 and then, incident upon an objective lens 45. The laser light transmitted through the objective lens 45 is projected onto an optical disk 50 so as to be converged on its signal surface 50a for point image formation.

The laser light subjected to the image formation is reflected by the signal surface 50a corresponding to the information (bits) recorded on the signal surface 50a and the laser light thus reflected is transmitted through the objective lens 45. The laser light is subsequently the half mirror 40 and converged on a light receiving face 60A of a light receiving element 60 for the point image formation.

It is to be noted here that the laser light received by the light receiving element 60 is subjected to light/current conversion by a light amount detector (not shown, and including the light receiving element 60) for effecting the necessary processing.

The laser diode unit 1 is fixed to a mounting member 20 secured to the optical pick-up 10, for example, to an aluminum die-cast casing of the optical pick-up 10, and is controlled for the light amount, etc. by a laser driving circuit 30 coupled therewith.

Meanwhile, an arrangement is made for the positioning of the mounting member (or casing) 20 so that the laser diode unit is positioned in the optical system (which mainly includes the half-mirror 40, the objective lens 45 and the light receiving element 60) of the optical pick-up 10. The laser light emitted from the laser diode unit 1 proceeds within the optical system when the laser diode unit 1 is fixedly mounted.

Figure 4:
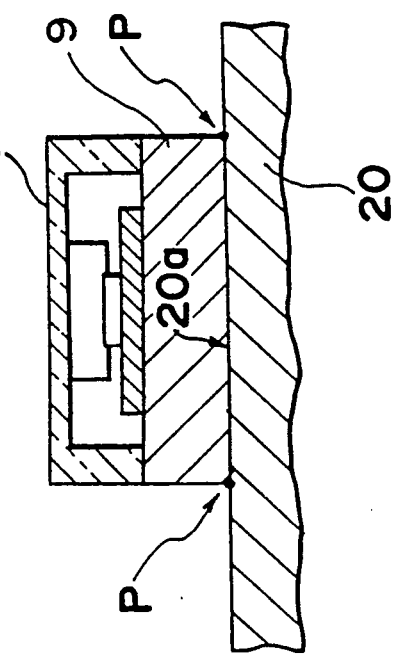
FIGS. 4 and 5 are schematic side sections for explaining the method of incorporating the laser diode unit into the optical pick-up in the arrangement of FIG. 1.

Hereinafter, methods of fixing the laser diode unit 1 on the mounting member 20 will be described with reference to FIGS. 4 and 5. FIG. 4 illustrates the case where the laser diode unit 1 is to be fixed no the mounting member 20 having a flat fixing surface, while FIG. 5 relates to the case where the unit 1 is to be secured no a mounting member 20' having a protruding fixing surface.

Figure 5:
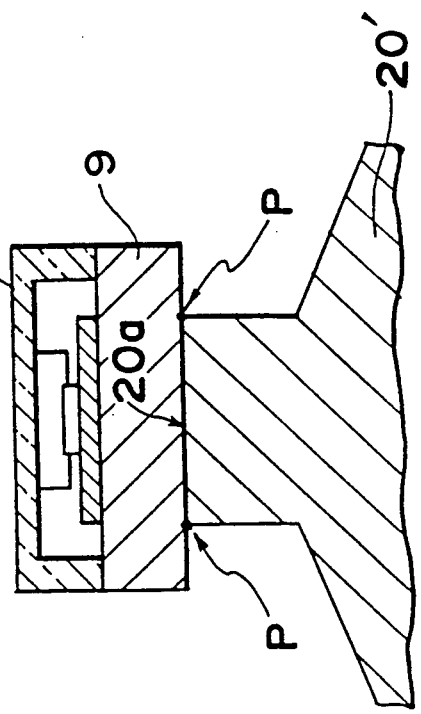

As illustrated in FIGS. 4 and 5, the mounting member 20 or 20' made, for example, of aluminum die-cast is formed with a unit fixing surface 20a which is to be subjected to face contact with respect to the reverse face of the aluminum substrate 9 (the other side face in the direction of thickness of the substrate 9, i.e. the surface opposite to the one side face of the substrate 9 on which the laser diode 5, etc. is mounted).

For mounting the laser diode unit 1, the laser diode unit 1 is first positioned no the fixing surface 20a, and subsequently, a plurality of spots P along the peripheral edge of the contact area between the substrate 9 and the unit fixing surface 20a are simultaneously welded by laser light, for example by a YAG laser or the like (not shown). In the above case, the laser diode unit 1 is so arranged to irradiate the laser light as soon as the laser diode unit 1 has been positioned and placed on the unit fixing surface 20a, and an angle of a projection unit of the YAG laser, etc. with respect to the reverse face of the substrate 9 should preferably be set at 45°.

It is to be noted here that, because the contact area between the fixing member 20 and the laser diode unit 1 (the reverse face of the substrate 9) is dependent on the shape and size of the unit fixing surface 20a of the mounting member 20, the unit fixing surface 20a is set in its shape and size to allow the laser diode unit 1 to be fixed at a sufficient strength.

The table below shows values of charging voltages of the YAG laser used for welding and fixing of the aluminum members to each other.

| Sample No. | Charging voltage (V) | Pulse width (ms) | Defocus (mm) | Power (J) |
| --- | --- | --- | --- | --- |
| 1 | 360 | 6.0 | 0 | 7.5 |
| 2 | 330 | 9.0 | 0 | 7.2 |
| 3 | 340 | 4.0 | 0 | 4.4 |
| 4 | 300 | 4.0 | 0 | 2.6 |

As is seen from the above description, according to the prevent embodiment, upon positioning and placing of the laser diode unit 1 on the unit fixing surface 20a of the mounting member 20, the laser light projection towards the plurality of places P along the peripheral edge of the contact are between the substrate 9 and the unit fixing face 20a is immediately effected, whereby such a plurality of spots P are welded at the same time.

As a result, it becomes possible to combine the laser diode unit 1 and the optical pick-up 10 into one unit in a short time, with the positioning of the laser diode unit 1 being maintained at a high accuracy.

As is clear form the foregoing description, in the mounting method of a laser diode unit according to the present invention, the laser diode unit is combined into one unit with the optical pick-up by simultaneously welding, by laser light, the plurality of spots where the other side face in the direction of thickness of the substrate and the mounting member contact each other.

Consequently, the laser diode unit as proposed by the same assignee as in the present inventional referred to earlier, may be incorporated into the optical pick-up in a short period of time, with the positioning at a high accuracy being maintained.

More specifically, according to the mounting method of the present invention, it is possible to effect highly accurate positioning and mounting even with respect to an optical pick-up having an allowance for the mounting only within a range of several $\mu$m, and the mounting can be effected quickly, while suppressing the temperature rise. Accordingly, as compared with mounting which employ, for example, bonding gents of resin or the like, brazing, screw tightening, or TIG welding, the mounting method of the present invention can provide higher accuracy, with simultaneous reduction of tact time. In other words, the mounting method of the present invention may be applied to an automatic assembling machine with high revolutions.

Although the present invention has been fully described by way of example with reference to he accompanying drawings, it is to be noted here that various changes and modifications will be apparent to those skilled in the art. Therefore, unless otherwise such changes and modifications depart from the scope of the present invention, they should be construed as included therein.

What is claimed is:

1. In an optical pick-up arranged to detect information recorded on an optical disk by causing laser light projected onto the reflected from a signal surface of said optical disk disposed within an optical system, to be received by a light receiving element provided in said optical system, a method of mounting a laser diode unit including metallic substrate having a first side face in a thickness direction, a laser diode, a photo-diode, a current feeding lead portion to the laser diode and a current output lead portion from the photo-diode, respectively onto the optical pick-up at said first side face in the thickness direction of said metallic substrate for emitting the laser light, said laser diode unit positioned and fixed at a predetermined position of said optical system through a mounting member, said mounting method of the laser diode unit comprising the steps of:
   (a) setting a second side face opposite to said first side face in the thickness direction of said substrate and said mounting member in a desired positional relation for contact with each other; and
   (b) subsequently welding a plurality of contact places therebetween simultaneously be laser light for combining said laser diode unit and said optical pick-up into one unit.

2. In an optical pick-up arranged to detect information recorded no an optical disk by causing laser light projected onto and reflected from a signal surface of said optical disk disposed within an optical system, to be received by a light receiving element provided in said optical system, a method of mounting the light receiving element on a first side face of a metallic substrate in a thickness direction by positioning and fixing the light receiving element at a predetermined position of said optical system through a mounting member, said mounting method comprising the steps of:
   (a) setting a second side face opposite to said first side face in the thickness direction of said substrate and said mounting member in a desired positional relation for contact with each other; and
   (b) subsequently welding a plurality of contact places therebetween simultaneously by laser light for combining said light receiving element and said optical pick-up into one unit.

3. A method of mounting a laser diode onto an optical pick-up, comprising the steps of:
   (a) positioning and fixing a light receiving element on a first side face of a metallic substrate in a thickness direction at a predetermined position in an optical system through a mounting member for receiving laser light projected onto and reflected from a signal surface of an optical disk to detect information recorded on said optical disk;
   (b) setting a second side surface opposite to said first side face in the thickness direction of said substrate and said mounting member in a desired positional relation for contact with each other; and
   (c) subsequently welding a plurality of contact places therebetween simultaneously laser light for combining said light receiving element and said optical pick-up into one unit.

* * * * *